United States Patent
Ahsan et al.

(10) Patent No.: US 7,119,545 B2
(45) Date of Patent: Oct. 10, 2006

(54) CAPACITIVE MONITORS FOR DETECTING METAL EXTRUSION DURING ELECTROMIGRATION

(75) Inventors: Ishtiaq Ahsan, Wappingers Falls, NY (US); Ronald Gene Filippi, Wappingers Falls, NY (US); Roy Charles Iggulden, Newburgh, NY (US); Edward William Kiewra, Verbank, NY (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 98 days.

(21) Appl. No.: 10/711,641

(22) Filed: Sep. 29, 2004

(65) Prior Publication Data

US 2006/0066314 A1    Mar. 30, 2006

(51) Int. Cl.
*G01R 31/08*    (2006.01)
*G01R 27/26*    (2006.01)

(52) U.S. Cl. .................. 324/519; 324/663; 324/686

(58) Field of Classification Search ............... 324/519, 324/663, 686
See application file for complete search history.

(56) References Cited

U.S. PATENT DOCUMENTS

| 5,264,377 | A | | 11/1993 | Chesire et al. |
| 5,514,974 | A | | 5/1996 | Bouldin |
| 5,777,486 | A | * | 7/1998 | Hsu .......................... 324/765 |
| 6,091,080 | A | * | 7/2000 | Usui .......................... 324/519 |
| 6,598,182 | B1 | | 7/2003 | Lowitz et al. |

* cited by examiner

*Primary Examiner*—Anjan Deb
*Assistant Examiner*—Timothy J. Dole
(74) *Attorney, Agent, or Firm*—Lisa U. Jaklitsch (57) ABSTRACT

A method and apparatus for detecting metal extrusion associated with electromigration (EM) under high current density situations within an EM test line by measuring changes in capacitance associated with metal extrusion that occurs in the vicinity of the charge carrying surfaces of one or more capacitors situated in locations of close physical proximity to anticipated sites of metal extrusion on an EM test line are provided. The capacitance of each of the one or more capacitors is measured prior to and then during or after operation of the EM test line so as to detect capacitance changes indicating metal extrusion.

11 Claims, 5 Drawing Sheets

SECTION A-A'

CAPACITIVE MONITORS FOR DETECTING METAL EXTRUSION DURING ELECTROMIGRATION

BACKGROUND OF INVENTION

1. Technical Field

The present invention relates to electronic microcircuits and specifically to methods and apparatus for the detection of metal extrusion associated with electromigration in high-current-density settings.

2. Background of the Invention

Metal extrusion arising from electromigration, though known prior to the development of modern integrated circuits in the 1960s, did not present challenges to the design of electronic microcircuitry until metal connectors, or interconnects, became so small that current densities on the order of $10^6$ amps/cm$^2$ were common. Such large current densities cause heating of the metal interconnects, but most of the heat is rapidly conducted away by adjacent thermally conductive substrates and surfaces. Still, such high current densities and component temperatures can induce electromigration processes that can, in turn, adversely affect circuit reliability which is essential to the microelectronics industry wherein products typically must work for more than 10 years. Short service life is useful only in such short-lived applications as missile guidance systems. If the probability of failure of say a transistor is one in a million per year, then failure is a certainty in an IC comprised of a million transistors. And since modern ICs often contain more than 10 million circuit elements, acceptable reliability on the chip level must exceed one chance in a billion over a one-year period.

The physical basis of electromigration of metal atoms in an electrical conductor is related to the momentum exchange between conducting electrons and diffusing metal atoms in high-current situations. At any temperature above 0 K, atomic vibrations occur. These vibrations ("phonons") put a metal atom out of its perfect position about $10^{13}$ times each second and disturb the periodic potential, causing electron scattering. The scattering event makes the electron change direction, i.e., undergo acceleration for which there is a corresponding force. After many collisions (another word for the scattering event), the force averages out in the direction of electron flow. The force due to collisions of electrons to metal atoms is called the momentum exchange, which is the same as force. To provide sufficient momentum exchange to cause measurable effects, many electrons must be available to collide with the atoms. This can only happen in metals because many electrons are easily accelerated within an imposed electric field. Also, semiconductors have far fewer electrons and, in a true semiconductor, electromigration does not exist because there are insufficient charge carriers. However, electromigration can occur in semiconductor-like materials, such as silicon when they are so heavily doped as to act as if it were a metal. At dopant levels of around 1%, electromigration has been seen in polycrystalline silicon when the temperature coefficient of resistance (TCR) is positive. A positive TCR is probably a good definition of a metal.

The greatest momentum exchange occurs only at the sites where it is possible for atoms to move. Simply stated, electrons collide with metal atoms and produce a force in the direction of electron flow (for n-type materials, opposite for p-type materials). In general, the electromigration force is proportional to the current density.

Typically, electromigration-induced metal extrusion occurs at the anode end of an interconnect to which electrons and thus metal atoms flow, causing delamination/cracking in dielectric layers and eventually electrical shorting to adjacent current-carrying lines.

One early solution to the electromigration problem was to use conductors that were resistant to electromigration by alloying the aluminum with up to 4% copper. Due to processing considerations, the amount of copper was decreased to about 0.5%. However, the electromigration problem persists as IC technology is pushed to ever higher component densities. Electromigration is also considered a potential reliability concern in copper interconnects, even though copper is less susceptible to electromigration failure.

In more recent times, a standard method for detecting extrusion failures arising from electromigration has been by the use of "extrusion monitors" that are situated close to (<1 μm) electromigration (EM) test lines. As the extrusion occurs in the EM test line during electromigration stress associated with high current densities, an electrical short or increase in leakage current is expected to occur between the EM test line and the parallel-running extrusion monitor wire or lead. In reality, however, this is often not the case, i.e., metal extrusion can occur without causing electrical contact with the extrusion monitor, and thus extrusion cannot be detected by this leakage current method.

The known prior art relates to general electromigration measurement. The following are some typical examples of relevant patents:

U.S. Pat. No. 5,264,377, which describes the wafer-level electromigration' test system, or so-called "SWEAT" test for fast in-line electromigration reliability monitoring. It does not mention detecting extrusion.

U.S. Pat. No. 5,514,974 proposes a chain of metal segments to accurately flag metal failure. This patent does not involve extrusion detection techniques, and thus is not relevant.

U.S. Pat. No. 6,598,182 ('182) describes a electromigration test system capable of real-time test monitor of metal resistance change as well as metal extrusion during electromigration stress. In other words, the extrusion monitor technique described in '182 is the standard detection method in which leakage current between the EM test line and the extrusion monitor wire is measured. Also, '182 discloses only the equipment to test the traditional structure, and it does not involve new structures or methods that are relevant to the present invention described in detail hereinbelow.

SUMMARY OF INVENTION

The present invention is a method and an apparatus for detecting metal extrusion associated with electromigration (EM) under high current density situations within an EM test line in an electrical circuit. The method is characterized by the steps of situating one end of an electrically conductive lead close to a single anticipated location of metal extrusion associated with electromigration on the EM test line, such that the end of the electrically conductive lead, in combination with the single anticipated location of metal extrusion, comprise together two charge storing surfaces of a single capacitor having an electrical capacitance. The capacitance of the single capacitor is measured prior to operation of the EM test line, and subsequent measurements of the capacitance of the single capacitor are made during or after operation of the EM test line. Measured changes in the capacitance of the single capacitor detect metal extrusion associated with electromigration. By situating one or more additional ends of one or more additional electrically conductive leads close to the single anticipated location of metal extrusion associated with electromigration on the EM test line, then additional capacitors and capacitances can be created and measured prior to, and during and/or after, testing of the circuit and EM test line so as to detect metal extrusion associated with electromigration due to its influence on the geometry of each of the capacitive elements. By connecting all the single capacitors in parallel, it is possible to increase the total capacitance of this capacitive means for detecting metal extrusion. Furthermore, by situating one or more additional ends of each of one or more additional electrically conductive leads close to one or more additional possible locations of metal extrusion on the same EM test line, then one or more capacitors having capacitance can be used to monitor more than one location of a since EM test line. The one or more capacitors monitoring a single test line can be connected in parallel to comprise a module having greater and more easily measurable capacitance. This method of capacitive probes can be used to monitor two or more EM test lines within a circuit. The respective capacitive probes monitoring each of two or more EM test lines can be connected such that the single capacitors comprised of ends of one or more electrically conductive leads close to one or more single anticipated locations of metal extrusion on each of the two or more EM test lines in parallel so as to create capacitive extrusion monitor modules, one for each EM test line. The extrusion monitor modules on each test line can also be connected in parallel such that two or more of each of the capacitive extrusion monitor modules become to create one or more capacitive extrusion monitor meta-modules, each of which can be equipped with a decoder to determine the specific EM test line in which metal extrusion has occurred. In all instances it is possible to incorporate in close proximity with each of the two or more EM test lines under examination one or more of the traditional leakage current type extrusion monitors.

The present invention also comprises a capacitive means for detecting metal extrusion and thereby monitoring and detecting metal extrusion associated with electromigration under high current density situations within EM test lines in a test circuit. More specifically, this capacitive means comprises one end of an electrically conductive lead or wire disposed in close proximity to an anticipated site of metal extrusion on an EM test line such that the combination of the anticipated site and the end of the electrically conductive lead comprise two charge storing surfaces of a capacitor having a capacitance that changes when a metal extrusion at the anticipated site influences the geometry and the capacitance of the capacitor. More generally, the capacitive means includes more than one electrically conductive leads disposed in close proximity to the same anticipated site of metal extrusion on given EM test line, or the capacitive means involving the charge storing surfaces of the ends of wires or leads such that in close proximity to at least two anticipated sites of metal extrusion on a single EM test line. The leads can be connected in parallel to create a module. Moreover, this capacitive means can be used to monitor metal extrusion at two or more anticipated sites of metal extrusion on each of at least two EM test lines. The capacitors comprised of charge storing surfaces of the ends of each of the more than one electrically conductive leads that monitor more than one EM test line can be connected in parallel to create one or more modules of parallel connected capacitors for each EM test line being monitored at the same time. Furthermore, the modules can be connected to create at one or more meta-modules of parallel connected modules for each set of two or more EM test lines. Each of the meta-modules can be equipped with a decoder to determine the specific EM test line in which metal extrusion has occurred. This capacitive means of extrusion monitoring can also be used in conjunction with the traditional leakage current type of extrusion monitors.

The present invention also comprises a capacitive means for detecting metal extrusion and thereby monitoring and detecting metal extrusion associated with electromigration under high current density situations within EM test lines in a test circuit. More specifically, this capacitive means comprises one end of an electrically conductive lead or wire disposed in close proximity to an anticipated site of metal extrusion on an EM test line such that the combination of the anticipated site and the end of the electrically conductive lead comprise two charge storing surfaces of a capacitor having a capacitance that changes when a metal extrusion at the anticipated site influences the geometry and the capacitance of the capacitor. More generally, the capacitive means includes more than one electrically conductive leads disposed in close proximity to the same anticipated site of metal extrusion on given EM test line, or the capacitive means involving the charge storing surfaces of the ends of wires or leads such that in close proximity to at least two anticipated sites of metal extrusion on a single EM test line. The leads can be connected in parallel to create a module. Moreover, this capacitive means can be used to monitor metal extrusion at two or more anticipated sites of metal extrusion on each of at least two EM test lines. The capacitors comprised of charge storing surfaces of the ends of each of the more than one electrically conductive leads that monitor more than one EM test line can be connected in parallel to create one or more modules of parallel connected capacitors for each EM test line being monitored at the same time. Furthermore, the modules can be connected to create at one or more meta-modules of parallel connected modules for each set of two or more EM test lines. Each of the meta-modules can be equipped with a decoder to determine the specific EM test line in which metal extrusion has occurred. This capacitive means of extrusion monitoring can also be used in conjunction with the traditional leakage current type of extrusion monitors.

BRIEF DESCRIPTION OF DRAWINGS

The structure, operation, and advantages of the present invention will become further apparent upon consideration of the following description taken in conjunction with the accompanying figures (FIGS.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

DETAILED DESCRIPTION

Aspects of the Invention

It is an aspect of the present invention to provide methods and/or apparatus as defined in one or more of the appended claims and, as such, having the capability of accomplishing one or more of the following subsidiary aspects.

One aspect of the present invention is to overcome the inherent deficiencies of the leakage current type extrusion monitors in which the electromigration induced extrusions might not make electrical contact with the extrusion monitor.

Another aspect of the present invention is to provide a method of detecting metal extrusion associated with electromigration by placing the charge carrying surfaces of one or more capacitors close to one or more likely locations of metal extrusion on the surface of a current carrying member, the method of capacitive extrusion detection being superior to the leakage current method because of the geometric considerations involved in the areas of the charge carrying surfaces and the separation distances associated with the charge carrying surfaces and the changes of capacitance that will necessarily arise from the electromigration in the vicinity of the charge carrying surfaces of each of one or more capacitive extrusion monitor(s) located near one or more locations where metal extrusion is anticipated to occur.

Another aspect of the present invention is to provide a capacitive method of extrusion monitoring that can be used in conjunction with traditional leakage current type extrusion monitors.

Yet another aspect of the present invention is to provide methods of parallel connecting of capacitive extrusion monitors so as to improve their overall extrusion monitoring sensitivities.

Still another aspect of the present invention is to provide capacitive methods of metal extrusion associated with electromigration that are more sensitive to small electromigration processes associated with high current density situations.

Definitions

Capacitive extrusion monitor probe refers to the single ends of wires that are disposed close to a location where metal extrusion is anticipated on a given EM test line; the word 'probe' is used below in situations where the single probe wire, which constitutes one charge storing surface of the capacitance that comprises a capacitive extrusion monitor in relation to the EM test line being monitored.

EM test line refers to a wire in which current densities within a given test line or test wire are of sufficient magnitude to induce metal extrusion of the sort associated with electromigration (EM).

Extrusion monitor refers to devices and methods for detecting metal extrusion associated with electromigration; when used herein without direct or contextual reference to capacitance, as in "capacitive extrusion monitor," or in contexts where the type of extrusion monitor is not specifically of the capacitive type, then this term refers to the traditional or standard method of measuring the leakage current to an extrusion monitor wire that is situated in physically close proximity to an EM test line, in which case the term "extrusion monitor" refers to the leakage current extrusion monitor of the sort that is designated hereinbelow as prior art.

Fails is a noun, plural, referring to such things as integrated circuits that have undergone failure, or it can be used to refer more specifically or locally to the components, such as current carrying wires that have undergone failure due to, in the context of this patent, metal extrusion associated with electromigration of sufficient magnitude to cause short circuits or other types of failure associated with electromigration.

Figure 1A:
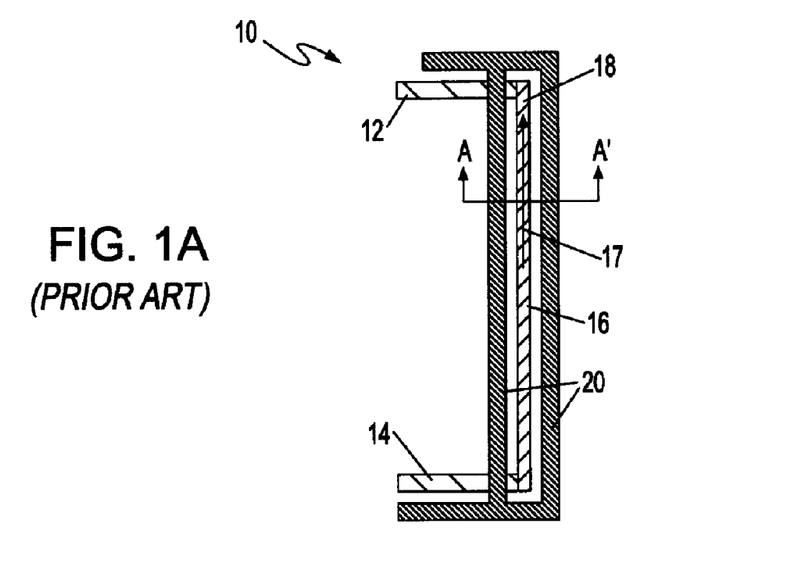
FIG. 1A is a schematic view of an EM test line using a traditional or prior art electrical leakage type of extrusion monitor.

Conventionally, extrusion fails are detected using an extrusion monitor as the schematically shown test structure 10 which is shown in schematic view in FIG. 1A. Metal wires 12 and 14 are shown with the interconnecting metal wire (or interconnect) 16 connected to them through interlevel vias. The interconnecting wire 16 is also known as the EM test line, where 'EM' stands for electromigration. The electron flow is in the direction of the arrow 17, toward the anode end 18 of the EM test line 16, which receives electrons from the wire 14.

Since electromigration and metal extrusion tends mostly to occur at the anode end of the EM test line 16, i.e., in the location where electrons arrive, then metal extrusion associated with electromigration is expected to happen in or near to the region 18 of the EM test line 16. An extrusion monitor 20 is situated close to (<~1 μm) both side the EM test line 16.

Figure 1B:
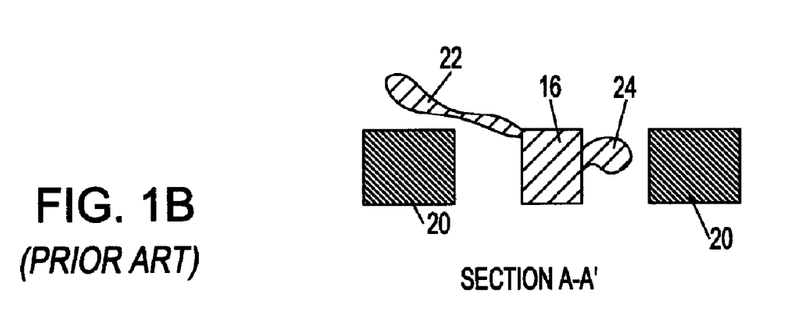
FIG. 1B is a schematic cross-sectional view of the EM test line circuit of FIG. 1A, showing metal extrusions projecting from the EM test line toward, but not touching, the extrusion monitor wire.

FIG. 1B is a cross-sectional view of the wires 16 and 20 according to the direction of A–A' shown in FIG. 1A. Metal extrusions 22 and 24 are shown migrating toward, or in the direction of, but not touching, the extrusion monitor 20. The deficiencies of the present leakage current method of metal extrusion detection are evident in the prior art views shown in FIGS. 1A and 1B; specifically, the extrusions 22 and 24 shown in FIG. 1B do not touch the extrusion monitor 20, which means that even though one or more metal extrusions might exist, the lack of metal-to-metal electrical contact between the EM test line 16 and the extrusion monitor wire 20 fails to detect any sort of electrical current flow between the extrusion monitor and the EM test line when a test voltage is placed across those separate electrical leads (16 and 20), the result being that the presence of one or more metal extrusions will not be detected.

The present invention describes a capacitive means for detecting metal extrusion associated with electromigration and a corresponding method. The invention makes use of electrical capacitance to detect the presence of metal extrusions associated with electromigration, because capacitance and changes in capacitance within a circuit do not require actual metal-to-metal conductive pathways. More specifically, if one end of an electrically conductive lead or wire is placed in close proximity to a single anticipated location of metal extrusion associated with electromigration on the EM test line, then the end of the electrically conductive lead, in combination with the single anticipated location of metal extrusion on an EM test line, together comprise two charge storing surfaces of a single capacitor having an electrical capacitance that can be measured. When a metal extrusion takes place at that single anticipated location, the extrusion will influence the geometry of the capacitor and thus its capacitance will change. That change in capacitance indicates the development of a metal extrusion. By situating one or more additional ends of one or more additional electrically conductive leads or wires close to the same single anticipated location, or close to multiple other anticipated locations on the same EM test line, or close to multiple other anticipated sites of metal extrusion on different EM test lines within the same circuit, then similar capacitors also have measurable capacitances can be thereby created and used to detect metal extrusions associated with electromigration. Capacitance is measured between two terminals of the test structure. The test system usually has methods of canceling out any parasitic capacitance that comes from the probe card that is used to measure the capacitance to increase accuracy. A direct current (D.C.) bias can be applied to the measuring terminals so that the capacitance can be measured with different D.C. voltages across the terminals. Typical voltage ranges vary from −10V to +10V. Capacitance is measured by superimposing a small signal alternating current (A.C.) signal on the D.C. signal and applying that signal across the terminals of the device and monitoring the response of the device to the signal using a capacitance meter. The frequency of the A.C. signal can be varied also to increase the accuracy of the measurement. Typical test frequencies range from 1 KHz to 1 MHz with some tester frequencies going up to 30 MHz. Higher test frequencies that make the measurement more robust to any leakage current can be present between the two capacitive plates. Our preferred test conditions are a D.C. voltage of 0V and a frequency of 1 MHz for good accuracy.

Figure 2A:
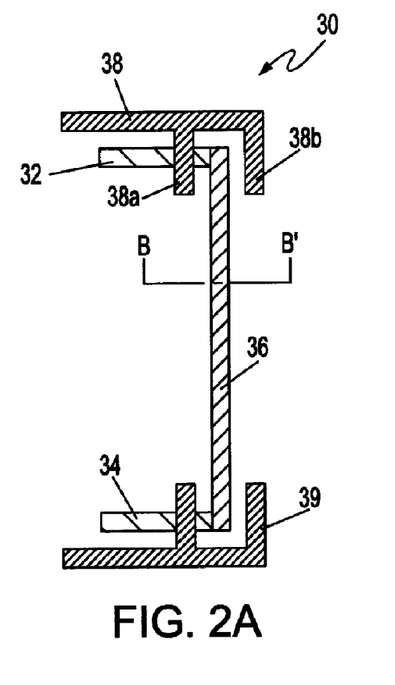
FIG. 2A is a schematic view of an EM test line, two ends of which make use of the capacitive extrusion monitor system according to the present invention.

Referring to FIG. 2A, there is shown a schematic view 30 in which two wires 32, 34 are connected by the interconnecting EM test line 36 through interlevel vias. Two capacitive extrusion monitors 38 and 39 (or capacitive extrusion monitor probes) are also shown in the FIG. 2A, in accordance with the principle of the present invention which is described hereinbelow in detail. That is, the capacitive ends of the capacitive extrusion monitors 38, 39 are placed near the ends of the EM test wire 36 where the extrusion is likely to happen. Capacitive extrusion monitors are located at both ends of the line since current may flow in either direction. These local capacitive monitors 38, 39 are electrically isolated from the rest of the wire 36. In addition to the proposed capacitance measurement associated with the capacitive extrusion monitors, the traditional leakage current monitoring measurement can be modified to intersect any extrusion that does not extend horizontally, as is discussed hereinbelow. The extrusion monitor wires 38, 39, can catch any extrusion that can otherwise "escape" leakage current type monitors so that the combination of capacitance and leakage current measurements can be used in detecting extrusions. Thus it is possible to detect metal extrusions associated with electromigration under high current density situations within an EM test line by situating charge storing surfaces of single capacitive extrusion monitor probes (having measurable electrical capacitance relative to the EM test line being monitored) close to single anticipated locations of metal extrusion associated with electromigration and then measuring the capacitance of each single capacitive probe prior to operation of the EM test line, followed by subsequent measurements of the capacitance of the single capacitive probe during or after operation of the EM test line and thereby detecting changes in the capacitance of the capacitor as a way of detecting metal migration associated with electromigration.

Figure 2B:
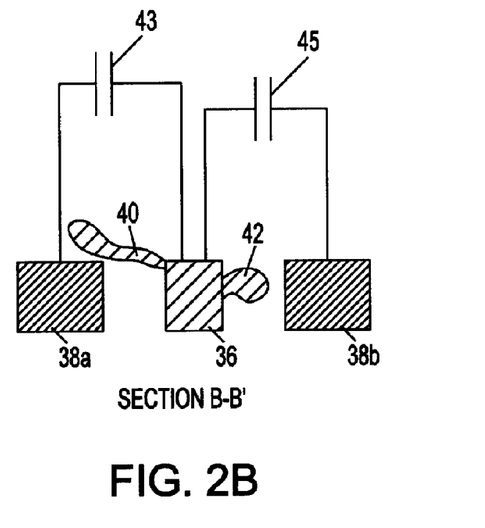
FIG. 2B is a schematic cross-sectional view of the EM test line circuit of FIG. 2A, showing metal extrusions projecting from the EM test line toward the capacitive extrusion monitor, thereby causing a change in capacitance.

FIG. 2B is a cross-sectional view of the EM test line 36 and the two parts of the capacitive extrusion monitor 38, with arms 38a and 38b, according to the directional view, B–B' shown in FIG. 2A. Metal extrusions 40 and 42 are shown migrating toward, but not touching, the arms 38a and 38b, respectively, of the capacitive extrusion monitor 38 according to the present invention. Also shown in FIG. 2B are standard symbols for electrical capacitors, 43 and 45, which correspond to the capacitance between the EM test line 36 and the arms 38a, 38b of the capacitive extrusion monitor 38. More specifically, whether or not either of the extrusions 40, 42 is present, the equivalent capacitances 43, 45 associated with arms 38a and 38b, respectively, relative to the EM test line 36 will have non-zero value of capacitance. But, in the event of one or more metal extrusions, such as 40 and/or 42, is present, the respective capacitances 43, 45, one or the other or both, depending on the shapes of the extrusions and their distances from the EM test line 36, will increase in accordance with the basic equation for capacitance:

$$C = \epsilon_o A/d \qquad (1)$$

wherein C is the capacitance associated with the area, A, of the capacitor plates separated by an effective distance, d; and $\epsilon_o$ is the permittivity constant. Since the extrusions are typically large in relation to the line width, the capacitance monitor can be placed a larger distance from the tested EM line. This increase in distance will result in a more sensitive capacitance monitor because the relative change in metal to metal distance will increase as the spacing increases.

Referring to FIG. 2B, it should be evident to those knowledgeable of the art that if an extrusion 42 progresses toward the arm 38b of the extrusion monitor 38, then the geometry of the capacitor comprised of ends of one or more electrically conductive leads close to one or more single anticipated locations of metal extrusion on each of one or more EM test lines creates a system of capacitive extrusion monitors for each of one or more EM test lines; i.e., the value of d in Eqn. (1) will change such that the capacitance between arm 38b and the EM test line 36 will also change (i.e., the circuit capacitance indicated by the symbolic capacitor 45 will change). Likewise in the case of the extrusion 40, which is shown progressing near to the arm 38a, in which instance the value of the area A in Eqn. (1) increases while d also decreases such that the net effect is an increase in the capacitance indicated by the capacitor symbol 43. In overall effect, any metal extrusion 40 or 42 will cause a change in capacitance between the extrusion monitor 38 (FIG. 2A) and the EM test line 36. Said change in capacitance will be detectable by means of periodic sampling of the capacitance values between the EM test line 36 and the extrusion monitor 38, said sampling being performed by introducing an appropriate signal into the EM test line and the extrusion monitor wires. And since the extrusion is expected to occur at the anode end of the EM test line, the capacitance monitor wire 38 can be reduced to focus on the local area of interest, and thus significantly increase the sensitivity of the capacitance measurements.

Figure 2C:
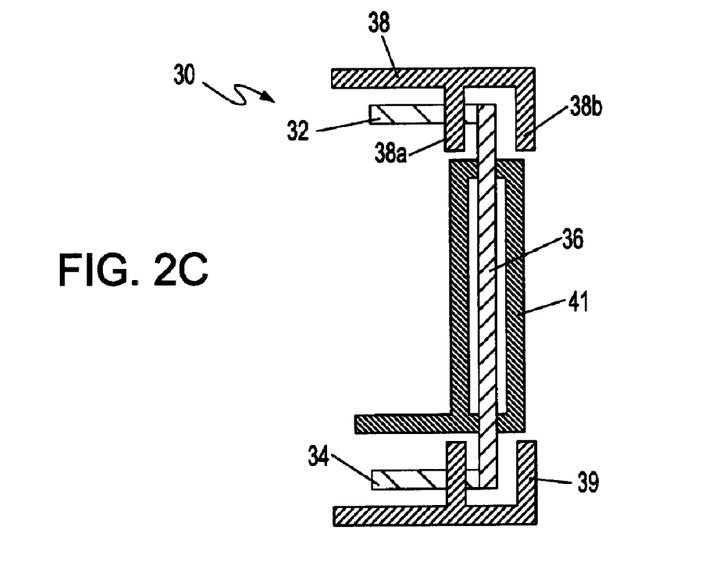
FIG. 2C is a schematic view of the instant capacitive extrusion monitor invention being used in conjunction with the traditional prior art type extrusion monitor.

The inventors envision that the present capacitive method and apparatus of extrusion monitoring can be used in conjunction with the prior art or traditional method and apparatus described hereinabove by incorporating, adjacent the EM test line, one or more leakage current type of extrusion monitors. That is to say, the inventors envision a combination of capacitance and leakage current measurements for extrusion detection, as illustrated schematically in FIG. 2C, which contains the same elements shown in FIG. 2A but with the schematic addition of the traditional leakage current type extrusion monitor 41 along with the capacitive type extrusion monitors (38 and 39, shown in FIG. 2C) according to the present invention. In FIGS. 2A, 2B and 2C, the electromigration line and extrusion monitor correspond to the same metal level. In the case that extrusions propagate vertically, as shown by extrusion 40 in FIG. 2B, it is beneficial to have a capacitive type extrusion monitor also present at an upper metal level.

Figure 3:
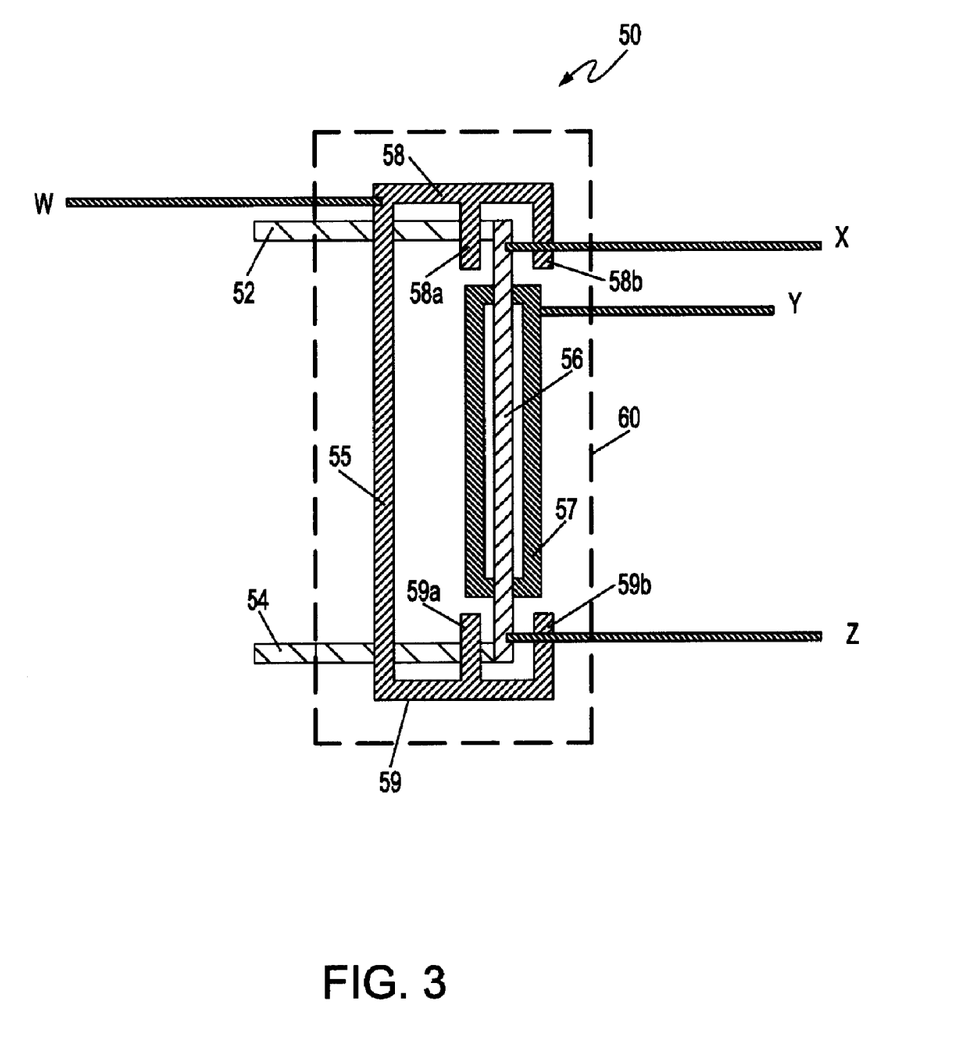
FIG. 3 is a schematic view of an EM test line fitted with two capacitive extrusion monitors wired in parallel to comprise an extrusion test block Module A.

The inventors further envision that increased sensitivity of their capacitive extrusion monitor invention can be achieved by connecting a number of these capacitive structures in parallel, i.e., by situating one or more additional charge storing surfaces of one or more additional capacitors, each having an electrical capacitance, close to single anticipated locations of metal extrusion associated with electromigration. In other words, since it could be difficult to measure the capacitance of one such structure, as say capacitive extrusion monitor 38 (FIG. 2A), it might be necessary to tie a number of these structures in parallel. The inventors further envision that a number of measurement blocks (Modules A) can be tied in parallel (to make Modules B, as discussed hereinbelow in relation to FIGS. 4A and 4B) to increase the total capacitance which can be easily measured. FIG. 3 shows an EM test line circuit 50 having two capacitive extrusions monitors 58, 59 connected in parallel by way of link 55. The monitors 58, 59 detect extrusion changes in the dimensions of the ends of the EM test line 56 which are connected to electrical leads 52 and 54 through interlevel vias. The arms 58a and 58b would be used for detecting an extrusion when the electron flow is from the electromigration line 56 to the electrical lead 52. The arms 59a and 59b would be used for detecting an extrusion when the electron flow is from the electromigration line 56 to the electrical lead 54. The two parallel linked capacitive extrusion monitors 58, 59 comprise the operative sensing elements of a measurement block or module (Module A) 60 (denoted by a dashed line). Thus metal extrusion will be detectable by situating charge storing surfaces of one or more additional capacitors each having an electrical capacitance disposed in close physical proximity to the single anticipated location of metal extrusion associated with electromigration on the EM test line, and then connecting the one or more of the one or more additional capacitors into at least two parallel capacitive circuits. Then, by measuring the capacitance of each parallel capacitive circuit and of any one or more single capacitors prior to operation of the EM test line, extrusion can be detected by making subsequent capacitance measurements of each parallel capacitive circuit and of any one or more individual capacitors during or after operation of the EM test line, thereby detecting changes in the capacitance of each parallel capacitive circuit during or after operation of the EM test line. Yet further improvement of extrusion detection can be achieved, if desired, by incorporating in close physical proximity to the EM test line one or more leakage current type of extrusion monitors. In FIG. 3, the electromigration line and extrusion monitor correspond to the same metal level. In the case that extrusions propagate vertically, it is beneficial to have a capacitive type extrusion monitor also present at an upper metal level.

The inventors envision that any number of capacitive extrusion monitors (or capacitive extrusion monitor probes) can be arrayed in such parallel electrical arrangement comprising a measurement block (Module A) designated by 60 in FIG. 3. And the inventors also envision a plurality of measurement blocks (Modules A) can be connected in parallel (to make one or more Modules B) to increase the total capacitance being measured.

Figure 4A:
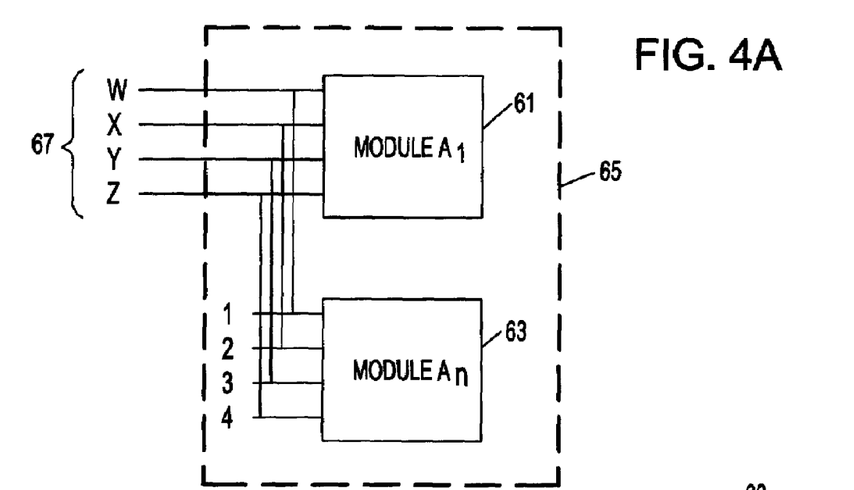
FIG. 4A is a schematic view of Module A, fed by leads, through an arbitrary number of additional Modules $A_n$.

FIG. 4A is a schematic view of Module $A_1$ 61, fed by leads W, X, Y, and Z, through an arbitrary number of additional Modules $A_n$ 63, feed by leads 1, 2, 3, and 4, wired in parallel to comprise a Module B 65.

Figure 4B:
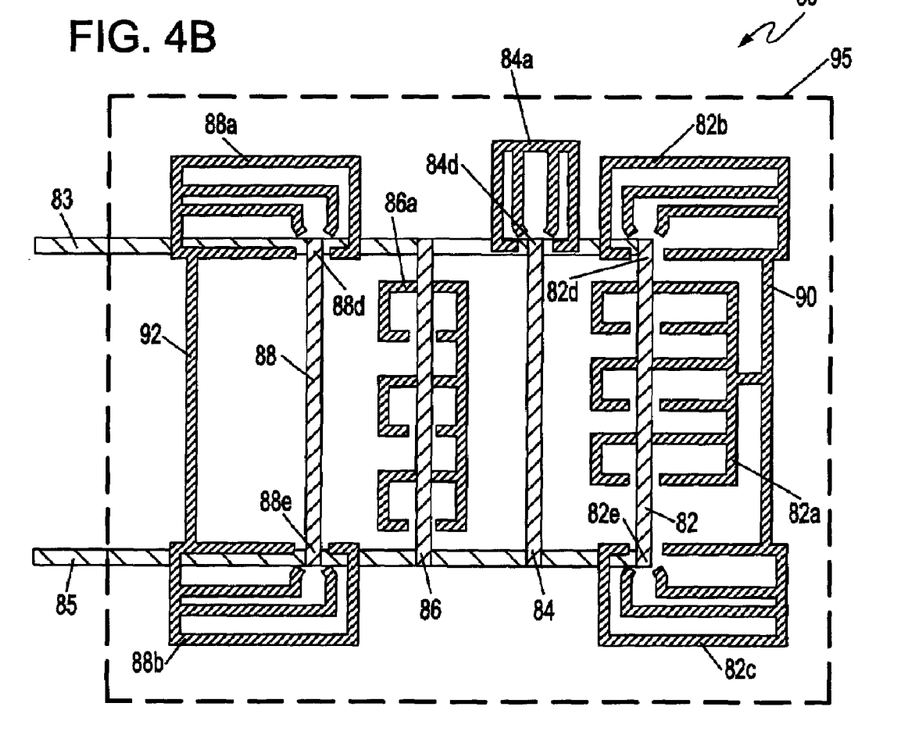
FIG. 4B is a schematic view of a multiplicity of EM test lines having capacitive extrusion monitors comprising extrusion test blocks which are themselves parallel connected into another higher level of test block Module.

FIG. 4B is another schematic view of a circuit 80 comprising four separate EM test lines 82, 84, 86, 88 which are, for the sake of simplicity of the drawing, shown as being parallel wired across the two leads 83, 85; that is to say, the four EM test lines 82, 84, 86, 88 could be located within unrelated portions of a given test circuit. Each EM test line is equipped with one or more sets or blocks or, as so-labeled further on in relation to all the blocks on any single EM test line, modules of capacitive extrusion monitor probes according to the present invention. EM test line 82 has one block 82a of three parallel connected capacitive extrusion monitors disposed near its middle portion, a second block 82b of four parallel wired extrusion monitors disposed around the end 82d, and a third block 82c of four parallel wired extrusion monitor probes disposed around the end 82e. The three blocks 82a, 82b and 82c are connected in parallel by way of connecting wire 90. EM test line 84 has one block 84a of four parallel connected capacitive extrusion monitors disposed around the end 84d. EM test line 86 has one block 86a of three parallel connected capacitive extrusion monitors disposed about its middle portion. EM test line 88 has one block 88a of four parallel wired extrusion monitors disposed around the end 88d, and a second block 88b of four parallel wired extrusion monitors disposed around the end 88e. The two blocks 88a, 88b are connected in parallel by way of the connecting wire 92.

The measurement blocks associated with a single EM test line are, collectively, a module. Such modules can themselves, as described above in relation to FIG. 3, be connected in parallel so as to comprise measurement block modules as follows: Measurement blocks 82a, 82b, 82c associated with the test line 82 can be parallel wired into a single Module A1 90; measurement block 84a associated with the end 84d of test line 84 comprises Module A2 92; measurement block 86a associated with the middle region of test line 86 comprises Module A4 94; and measurement block 88a associated with the end 88d of test line 88, along with measurement block 88b which monitors end 88e of EM test line 88 together comprise Module A3 96.

The aforementioned Modules A1, A2, A3 and A4 can themselves be parallel wired yet further into meta-modules such that multiple EM test lines can be monitors together for metal extrusion. This is illustrated in FIGS. 4A and 4B which show multiple Modules $A_n$ comprising a single meta-module, Module B 65 and 95, respectively. The capacitance of each measurement block, and each Module A within any given meta-module, as is Module B, can be individually measurable, which ensures that even if the capacitance measurements of some of the Module A blocks become useless due to shorting between a given EM test line and one or more of the capacitive extrusion monitors, the Modules B will still be able to obtain capacitance data from the other Modules A feeding into them. Having structures in parallel and measuring the total capacitance means that it will not be possible to determine which individual locations on an EM test line within a given Module A is at fault. Thus, complete statistical information about extrusion fails will be difficult to obtain using this approach; however, some failure statistics can be obtained by monitoring the capacitance change with time and determining the number of extrusion fails required to produce a given capacitance value. In FIG. 4B, the electromigration line and extrusion monitor correspond to the same metal level. In the case that extrusions propagate vertically, it is beneficial to have a capacitive type extrusion monitor also present at an upper metal level.

Figure 5:
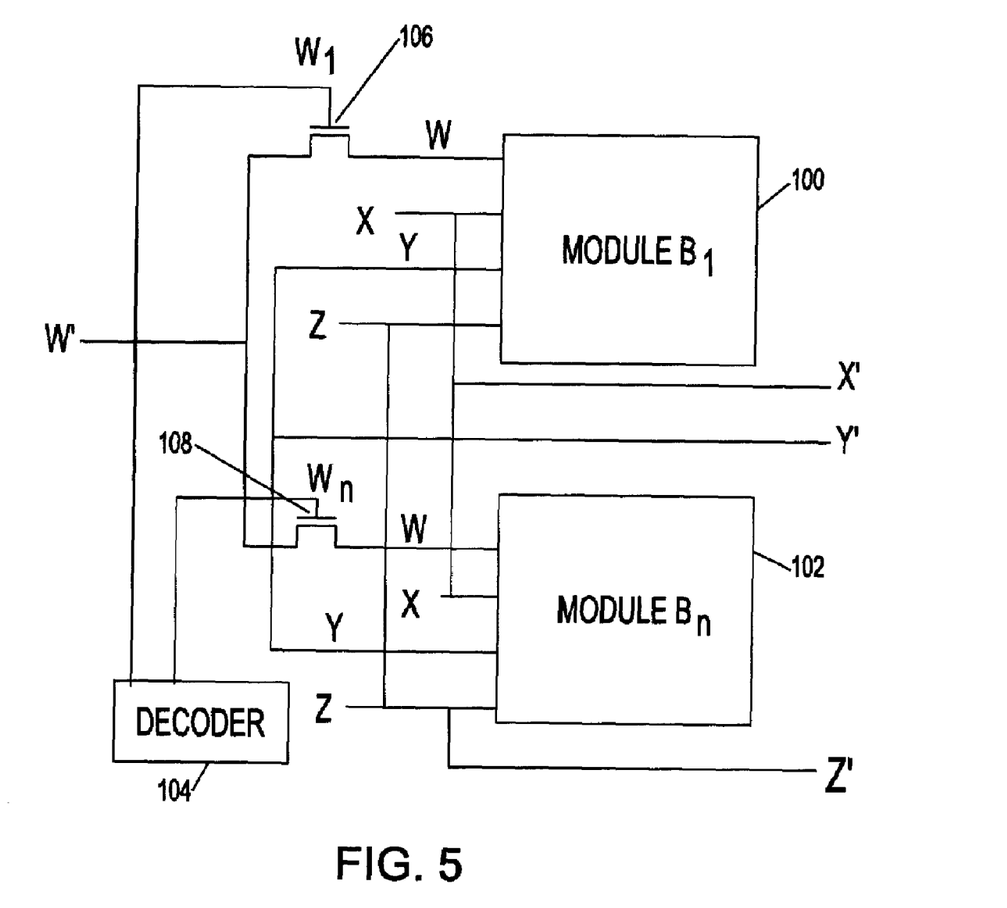
FIG. 5 is a schematic view of two higher level hierarchical Modules with a decoder that allows the finding of metal extrusion faults.

FIG. 5 is a schematic view of two Modules B 100, 102 that are connected in parallel again for them to be individually addressed using a decoder 104. The second Module $B_n$ represents one or more additional Modules B, which tie into the decoder 104. Wires (shown as W, X, Y, and Z in the FIGURE) connect with various Modules A, as per FIGS. 3, 4A and 4B. This way the capacitance of each of these blocks will be individually measurable. It ensures that even if the capacitance measurements of some of the Module A blocks become useless due to shorting, it will still be possible to obtain capacitance data from other modules.

By situating each capacitive extrusion monitor probe of a first set of at least two probes, each having an electrical capacitance relative to the EM test line being monitored, in close physical proximity to at least one or more anticipated locations of metal extrusion associated with electromigration on an EM test line, and by further situating a second set of at least two capacitive extrusion monitor probes close to one or more other anticipated locations of metal extrusion associated with electromigration on the EM test line, and connecting in parallel the capacitive extrusion monitor probes of the first set and also connecting in parallel the capacitive extrusion monitor probes of the second set of at least two capacitors with one another, then the measuring of the total capacitance of the capacitive extrusion monitor probes of the first set of at least two parallel connected capacitors and the total capacitance of the second set of at least two parallel connected capacitive extrusion monitor probes prior to operation of the EM test line serves as a baseline for comparison with data from the making of subsequent capacitance measurements during or after operation of the EM test line. In other words, the presence of metal extrusion associated with electromigration can be determined by detecting changes in the total capacitance of the capacitive extrusion monitor probes of the first set of at least two parallel connected probes and the capacitances of the second set of at least two parallel connected capacitive extrusion monitor probes during or after operation of the EM test line.

The inventors also consider that in all applications described herein of their capacitive extrusion monitor method and apparatus that the traditional or standard leakage current type extrusion monitors can additionally be used as yet a further way to detect metal extrusions on EM test lines.

Where local capacitance monitors are further reduced to very small areas and placed at various locations it will be possible to (1) have even higher sensitivity to local extrusion, and (2) determine the location and size of a given metal extrusion. By scanning through the capacitance of each local extrusion monitor block, the distribution of the capacitance values can help locate the extrusion.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method for detecting metal extrusion associated with electromigration (EM) under high current density situations within an EM test line, the method comprising the steps of:
   situating one end of an electrically conductive lead close to a single anticipated location of metal extrusion associated with electromigration on the EM test line, such that the end of the electrically conductive lead in combination with the single anticipated location of metal extrusion together comprise two charge storing surfaces of a single capacitor having an electrical capacitance;
   situating one or more additional ends of one or more additional electrically conductive leads close to the single anticipated location of metal extrusion associated with electromigration on the EM test line, such that the end of each additional electrically conductive leads in combination with the single anticipated location of metal extrusion comprise charge storing surfaces of one or more additional capacitors each having an electrical capacitance;
   connecting the single capacitor and the one or more additional capacitors in parallel;
   measuring the capacitance of the single capacitor and the capacitances of the one or more additional capacitors prior to operation of the EM test line;
   making subsequent measurements of the capacitance of the single capacitor and the capacitances of the one or more additional capacitors during or after operation of the EM test line; and
   detecting changes in the capacitance of the single capacitor and the capacitances of the one or more additional capacitors to detect metal extrusion associated with electromigration.

2. The method of claim 1 further including the steps of:
   situating the one or more additional ends of each of the one or more additional electrically conductive leads close to one or more additional possible locations of metal extrusion associated with electromigration on the EM test line, such that each end of each electrically conductive lead in combination with each additional possible location of metal extrusion together comprise charge storing surfaces of one or more additional capacitors each having an electrical capacitance;
   connecting the single capacitor and the one or more additional capacitors in parallel;
   measuring the capacitance of the single capacitor and the capacitances of each of the one or more additional capacitors prior to operation of the EM test line;
   making subsequent measurements of the capacitance of the single capacitor and the capacitances of the one or more additional capacitors during or after operation of the EM test line; and
   detecting changes in the capacitance of the single capacitor and the capacitances of the one or more additional capacitors to detect metal extrusion associated with electromigration.

3. The method of claim 2 further including the step of forming a module from the connecting of the single capacitor and the one or more additional capacitors in parallel.

4. A method for detecting metal extrusion associated with electromigration (EM) under high current density situations within two or more EM test lines within a circuit, the method being characterized by the steps of;
- situating the ends of one or more electrically conductive leads close to one or more anticipated locations of metal extrusion associated with electromigration on one of the two or more EM test lines, such that each end of each electrically conductive lead in combination with each of the one or more anticipated locations of metal extrusion on each of the two or more EM test lines together comprise two charge storing surfaces of one or more capacitors each having an electrical capacitance;
- connecting the one or more capacitors comprised of ends of one or more electrically conductive leads close to the one or more single anticipated locations of metal extrusion on each of the two or more EM test lines in parallel to create a capacitive extrusion monitor module for each EM test line;
- measuring the capacitance of each module on each of the two or more EM test lines prior to operation;
- making subsequent measurements of the capacitance of each module during or after operation of the EM test line; and
- detecting changes in the capacitance of each module to detect metal extrusion associated with electromigration.

5. The method of claim 4 further including the steps of:
- connecting in parallel two or more of each of the capacitive extrusion monitor modules of each of the two or more EM test lines within the circuit to create one or more capacitive extrusion monitor meta-modules;
- measuring the capacitance of each meta-module prior to operation;
- making subsequent measurements of the capacitance of each meta-module during or after operation; and
- detecting changes in the capacitance of each meta-module to detect metal extrusion associated with electromigration.

6. The method of claim 5 further including the steps of:
- connecting in parallel two or more of each of the capacitive extrusion monitor meta-modules; and
- equipping all of the two or more capacitive extrusion monitor meta-modules with a decoder to determine the meta-module in which metal extrusion has occurred.

7. The method of claim 6 further including the step of incorporating in close proximity with each of the two or more EM test lines within the circuit one or more leakage current type extrusion monitors.

8. An apparatus for monitoring and detecting metal extrusion associated with electromigration (EM) under high current density situations within EM test lines within a test circuit, the apparatus comprising: capacitive means for detecting metal extrusion, wherein the capacitive means comprises ends from more than one electrically conductive leads each disposed in close proximity to at least one anticipated site of metal extrusion on each of at least two EM test lines such that the combination of each anticipated site on each of the at least two EM test lines and the ends of the electrically conductive leads in close proximity thereto comprise charge storing surfaces of one or more of the capacitors each having a capacitance that changes when a metal extrusion at the at least one of the anticipated sites on the at least two EM test lines influences the geometry and the capacitance of the one or more of the capacitors, wherein the capacitors comprised of charge storing surfaces of the ends of each of the more than one electrically conductive leads disposed in close proximity to one or more of each of at least one anticipated site on each of the at least two EM test lines are connected in parallel to create one or more modules of parallel connected capacitors for each of the at least two EM test lines.

9. The apparatus of claim 8 wherein each of the one or more modules of parallel connected capacitors for each of the at least two EM test lines are parallel connected to create at least one or more meta-modules of parallel connected modules for each set of one or more EM test lines.

10. The apparatus of claim 9 wherein two of more of each of the capacitive extrusion monitor meta-modules are connected in parallel and equipped with a decoder to determine the meta-module in which metal extrusion has occurred.

11. The apparatus of claim 10 wherein one or more of the EM test lines is further monitored for metal extrusion by the use of one or more standard leakage current type extrusion monitors.

* * * * *